United States Patent [19]

Bois

[11] 4,412,235

[45] Oct. 25, 1983

[54] INTEGRATED OPTO-ELECTRONIC RELAY USING A SEMICONDUCTOR WITH PERSISTENT PHOTOCONDUCTIVITY AND A MATRIX OF SUCH RELAYS

[76] Inventor: Daniel Bois, 9, rue de la Grange, 38240 Meylan, France

[21] Appl. No.: 234,005

[22] Filed: Feb. 12, 1981

[30] Foreign Application Priority Data

Feb. 21, 1980 [FR] France ................. 80 03814

[51] Int. Cl.³ ............... H01G 31/12; H01G 27/14
[52] U.S. Cl. ................................. 357/19; 357/16; 357/17; 357/30; 357/83
[58] Field of Search ............ 357/19, 17, 16, 58, 357/83, 30 B, 1, 6, 61

[56] References Cited

U.S. PATENT DOCUMENTS 3,748,480  7/1973  Coleman ................. 357/19
4,167,791  9/1979  Banavar et al. ........... 357/1 X
4,186,407  1/1980  Delagebeaudeuf et al. ..... 357/16 X

FOREIGN PATENT DOCUMENTS 8003814  2/1980  France .
1112985  8/1966  United Kingdom .

OTHER PUBLICATIONS

R. J. Nelson, "Long-lifetime photoconductivity effect in n-type GaAlAs", *Applied Physics Letters*, vol. 31, No. 5 (1977), pp. 351-353.

C. J. Nuese, M. Ettenberg, R. E. Enstrom, and H. Kressel, "Cw laser diodes and high-power arrays in $In_x Ga_{1-x}As$ for 1.06-μm emission", *Applied Physics Letters*, vol. 24, No. 5 (1974), pp. 224-227.

*Primary Examiner*—James W. Davie
*Assistant Examiner*—J. Carroll
*Attorney, Agent, or Firm*—Harold L. Stowell

[57] ABSTRACT

Integrated opto-electronic relay of the type comprising a first semiconductor layer material having a persistent photoconductivity which is deposited on a major surface of an insulating substrate and is provided with two electrical contacts, a second semiconductor layer deposited on the opposite major surface of the insulating substrate provided with two electrical contacts and functioning as both an optical radiation source when forward biased and as a thermal radiation source when reversed biased, the radiation directed onto the first semiconductor layer to induce persistent photoconductivity in the first layer when optically exposed and to eliminate the conductivity when thermally exposed, and an enclosure enabling low temperature control of the first layer having persistent photoconductivity. The invention also relates to a switching matrix incorporating a plurality of these relays.

7 Claims, 4 Drawing Figures

INTEGRATED OPTO-ELECTRONIC RELAY USING A SEMICONDUCTOR WITH PERSISTENT PHOTOCONDUCTIVITY AND A MATRIX OF SUCH RELAYS

BACKGROUND OF THE INVENTION

The present invention relates to an integrated opto-electronic relay using a semiconductor with persistent photoconductivity and a matrix of such relays. It is used in the switching of electrical signals.

Switching is generally carried out by electromechanical or electromagnetic relays. However, these devices are not entirely satisfactory, because they have large dimensions and require a by no means negligible power supply.

The present invention relates to a switching element obviating these disadvantages. For this purpose, the invention uses semiconductors which permit extensive integration and require only low control and holding energy levels.

The essential element of the relay according to the invention is a layer of material having the persistent photoconductivity phenomenon. This phenomenon is theoretically described in the following articles:

R. J. NELSON, Appl. Phys. Lett. 31, 5, 315, 1977;
D. V. LANG, R. A. LOGAN, Phys. Rev.Lett. 39, 10 635, 1977
U. PIEKARA, J. M. LANGER Sol. Stat. Comm. 23, 583, 1977
R. LEGROS, Y. MARFAING, R. TRIBOULET J.Phys.Chem.Solids 39, 179, 1978.
B. BALLAND, G. VINCENT, D. BOIS, Appl. Phys. Lett. 34. 108. 1979.

The use of the material having persistent photoconductivity for producing an opto-electronic device is not novel per se. French Patent application No. 2,396,420 filed on June 29th 1977 and entitled "Transparent photoconductor material, its production process and devices using it" describes for example a "memory device" using as the photoconductor material a substoichiometric amorphous oxide of a metal belonging to group VI and more particularly a tungsten oxide.

Such a device has numerous disadvantages through the use of this type of oxide as the photoconductor material. Firstly, it is not suitable for the integration of its elements and it therefore has large dimensions. Furthermore, the excitation radiation is necessarily in the ultraviolet, which makes the excitation source difficult to use. Finally, the heating of the photoconductive layer, as a result of which it is possible to eliminate the conductivity of the material, can only be obtained by a means separate from that of the ultraviolet source.

BRIEF SUMMARY OF THE INVENTION

All these disadvantages are obviated by the device according to the invention through the use of semiconductor materials for forming the photoconductive layer, the substrate and the excitation sources (permitting the integration of all these elements by means of per se known methods such as epitaxy, ion implantation, doping, etc) and the use of a semiconductor light-emitting diode which simultaneously fulfils the two roles of photon excitation source leading to the appearance of a persistent conductivity in the semiconductive layer and heat source permitting the elimination of said conductivity.

More specifically, the present invention relates to an integrated opto-electronic relay of the type comprising a layer of material having a persistent photoconductivity which is deposited on a substrate and is provided with two electrical contacts, an optical radiation source directed onto said layer, an enclosure able to raise the layer to a temperature at which the persistent photoconductivity phenomenon takes place and a thermal radiation source able to heat the layer so as to eliminate the conductivity, wherein the substrate is of a first semiconductor material made insulating and the layer is of a second semiconductor material and is deposited on the substrate and wherein the said sources are formed by the same diode based on a third semiconductor, said diode being integrated into the substrate facing the layer and is able to emit optical radiation when it is forward biased and thermal radiation when reverse biased.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
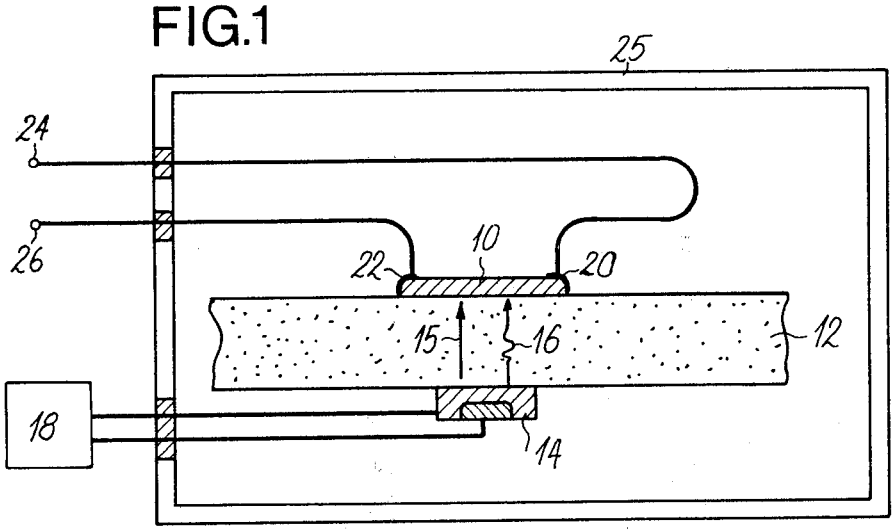
FIG. 1 diagrammatically and in section a relay according to the invention.

The relay of FIG. 1 comprises a layer 10 of a semiconductor material having the persistent photoconductivity phenomenon. This material is, for example, $Al_xGa_{1-x}As$, $GaAs_{1-x}P_x$, $Cd_{1-x}Zn_xTe$ (in which x is below 1), CdTe, $CdF_2$, GaSb, CdS, etc, these semiconductors being doped by impurities such as Te, Se . . . In. At each of its ends, layer 10 is connected to electrical contacts 20-22 connected to access terminals 24 and 26. The photoconductive layer is deposited on one of the faces of a substrate 12 constituted by a semiconductor material which is made insulating (e.g. GaAs). The other face of the substrate, facing layer 10, is provided with a diode 14 able to emit electromagnetic radiation 15 or a photon flux 16, depending on the command conditions supplied by a circuit 18. More specifically, when the diode is forward biased it behaves like a light-emitting diode and when it is reversed biased it constitutes a heat source. Such a diode can be obtained with ternary compounds such as $Ga_{1-y}In_yAs$. These means are placed in an enclosure 25 kept at a sufficiently low temperature for the persistent photoconductivity phenomenon to take place.

The device operates in the following manner. At low temperature, the material of layer 10 has an insulating action, all the electrons being trapped in impurities serving as a dopant for the material (Te, Se . . . for example in the case of $Ga_{1-x}Al_xAs$). Thus, the impedance between contacts 20 and 22 is high, the relay is open and there is an infinite impedance between terminals 24 and 26. When the diode 14 is controlled under electromagnetic radiation emission conditions, the emitted photon flux which, after passing through the substrate, reaches layer 10, induces electronic transitions in the latter. The trapped electrons are then brought into the conduction band of the material where they occupy a metastable state. The life of this state is relatively long at the temperature in question (several days at below 50° K.). The conductivity of the material of layer 10 is maintained after diode 14 has been stopped. The impedance between terminals 24 and 26 is and remains low, so that the relay is closed.

It can be opened again as a result of a momentary heating of the material of layer 10, because the life of the metastable state decreases exponentially with the temperature. This heating is obtained by the reverse biasing of diode 14, so that the latter emits a heat flux.

For information purposes, the characteristics of a relay according to the invention can be as follows:

Persistent photoconductor: $Ga_{1-x}Al_xAs$ with $x=0.35$, n doped by Te at a concentration of $10^{17} cm^{-3}$.

Contacts 20 and 22 joined by diffusion and tin soldering. Preparation of the photoconductive layer by liquid or vapour epitaxy using the method of organometallic compounds.

Substrate 12: GaAs monocrystal doped with chrome and therefore semi-insulating (resistivity above $10^9$ $\Omega cm$ at 300° K.).

Diode for 14: $p^+$-n junction of $Ga_{(1-y)}In_yAs$ with $y<1$ obtained by liquid or gaseous epitaxy. The p side is doped to degeneracy ($<10^{17} cm^{-3}$) by zinc diffusion through a mask in the n layer. The indium content (y) is selected so that the emission spectrum maximum coincides with the maximum of the absorption band of the impurity Te in $Ga_{1-x}Al_xAs$. The energy of the photons is approximately 1.1 eV for $y=0.3$. Heat emission is obtained by reverse biasing of the diode in order to start an avalanche process. Requisite operating temperature 50° K. and for ease of use it is possible to use a cryogenerator at 15° K. Average lateral dimensions for each relay between a few microns and a few hundred microns, as required.

Figure 2:
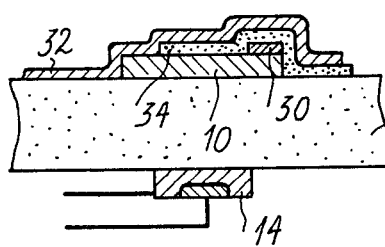
FIG. 2 in section, a special constructional embodiment of the contacts deposited on the photoconductive layer.

FIG. 2 illustrates an embodiment of the electrical contacts in which the conductive layers 30 and 32 are deposited on layer 10 in rectangular directions, while an insulating layer 34 insulates them from one another.

Figure 3:
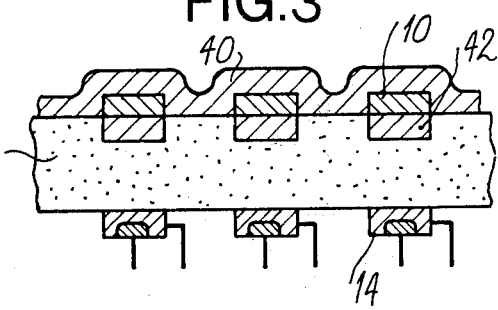
FIG. 3 in section, a special constructional embodiment of a plurality of relays deposited on the same substrate.

FIG. 3 illustrates an embodiment of a support incorporating a series of relays. In this drawing, each photoconductive layer 10 is in contact by its upper face with a metal band 40 and by its lower face with a conductive band 42 obtained by ion implantation of GaAs in the substrate in order to make it conductive.

Figure 4:
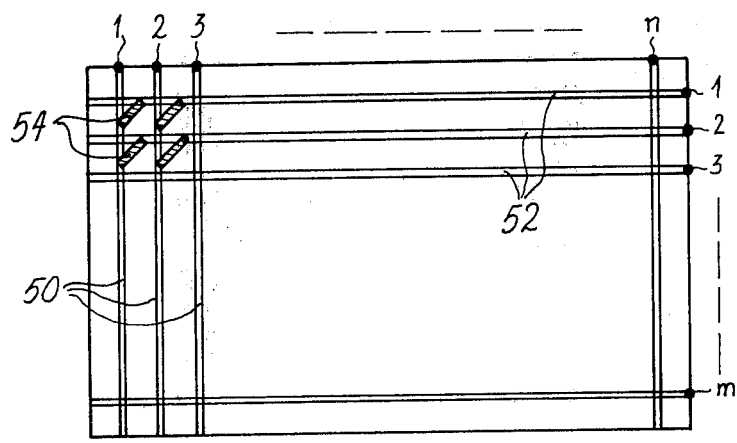
FIG. 4 a plan view of a relay matrix according to the invention.

The relay device of FIGS. 2 and 3 can be extended to two dimensions in order to constitute a relay matrix which, in plan view, is in the form shown in FIG. 4. This matrix comprises n vertical connecting bands 50 and m horizontal connecting bands 52, as well as nxm relays 54 positioned at the intersection of these bands. One of the systems of the conductive bands 40-52 can be obtained by ion implantation in the substrate with epitaxy of the photoconductive layer. The construction of such a matrix is simplified by the use of semiconductors.

What is claimed is:

1. An integrated opto-electronic relay comprising:
   an insulating substrate made of a first semiconductor material;
   a layer of a second semiconductor material having a persistent photoconductivity, said layer being deposited on said substrate, said layer being provided with two electrical contacts;
   a diode made of a third semiconductor material, said diode being integrated into said substrate facing the layer and being able to emit optical radiation directed onto said layer through said substrate when it is forward biased and to emit thermal radiation directed onto said layer through said substrate when it is reverse biased, an enclosure to enable low temperature control of the layer having persistent photoconductivity.

2. A relay according to claim 1, wherein the semiconductor constituting the persistent semiconductor layer is taken from the group including $Al_xGa_{1-x}As$, $GaAs_{1-x}P_x$, $Cd_{1-x}Zn_xTe$, (with $x<1$), CdTe, $CdF_2$, GaSb, CdS.

3. A relay according to claim 1, wherein the substrate is based on semi-insulating GaAs.

4. A relay according to claim 1, wherein the diode is a $p^+$-n junction of $Ga_{1-y}In_yAs$ with $y<1$.

5. A relay according to claim 1, wherein the electrical contacts are formed by two crossed conductive bands placed on the substrate and the layer, said bands being insulated from one another by an insulating layer.

6. A relay according to claim 1, wherein one of the contacts is formed by a conductive zone obtained by implantation in the substrate and the other contact is formed by a conductive layer obtained by deposition (metal layer or equivalent).

7. A switching matrix, wherein it comprises nm relays according to claim 1, wherein the contacts being formed by n parallel conductive spans intersecting m other parallel conductive bands.

* * * * *